(12) United States Patent
Vernenker et al.

(10) Patent No.: US 7,177,207 B1
(45) Date of Patent: *Feb. 13, 2007

(54) SENSE AMPLIFIER TIMING

(75) Inventors: Hemanshu T. Vernenker, Austin, TX (US); Margaret C. Tait, Austin, TX (US); Allen White, Austin, TX (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 63 days.

This patent is subject to a terminal disclaimer.

(21) Appl. No.: 11/015,369

(22) Filed: Dec. 17, 2004

(51) Int. Cl.
*G11C 7/00* (2006.01)

(52) U.S. Cl. .................. 365/194; 365/225.7; 326/39; 326/41

(58) Field of Classification Search ............. 365/194, 365/225.7; 326/39, 41
See application file for complete search history.

(56) References Cited

U.S. PATENT DOCUMENTS

| | | | |
|---|---|---|---|
| 4,687,951 A * | 8/1987 | McElroy | 327/291 |
| 4,787,047 A * | 11/1988 | Wei | 326/38 |
| 5,424,985 A | 6/1995 | McClure et al. | |
| 5,656,949 A * | 8/1997 | Yip et al. | 326/38 |
| 5,841,296 A | 11/1998 | Churcher et al. | |
| 5,991,219 A | 11/1999 | Nakashima | |
| 6,034,548 A | 3/2000 | Churcher et al. | |
| 6,133,751 A | 10/2000 | Churcher et al. | |
| 6,239,616 B1 | 5/2001 | Churcher et al. | |
| 6,480,024 B2 | 11/2002 | Dietrich et al. | |
| 6,499,111 B2 | 12/2002 | Mullarkey | |
| 6,710,622 B1 | 3/2004 | Chan | |
| 6,944,090 B2 * | 9/2005 | Anand et al. | 365/233 |

OTHER PUBLICATIONS

Louis De La Cruz and Allen White, Sense Amplifier Systems and Methods, U.S. Appl. No. 10/797,759, filed Mar. 9, 2004.

* cited by examiner

*Primary Examiner*—Richard Elms
*Assistant Examiner*—Eric J. Wendler
(74) *Attorney, Agent, or Firm*—MacPherson Kwok Chen & Heid LLP; Greg J. Michelson

(57) ABSTRACT

Systems and methods provide sense amplifier timing techniques. For example, in accordance with an embodiment of the present invention, an integrated circuit includes a plurality of memory cells and a sense amplifier that provides a sense amplifier output signal based on data provided by the plurality of memory cells, with the sense amplifier output signal provided under control of a sense amplifier enable signal. A delay control circuit provides a delay to the sense amplifier enable signal based on a value provided by at least one configuration fuse.

17 Claims, 4 Drawing Sheets

SENSE AMPLIFIER TIMING

TECHNICAL FIELD

The present invention relates generally to electrical circuits and, more particularly, to sense amplifiers.

BACKGROUND

Sense amplifiers are employed in a variety of applications to monitor, for example, data signals and provide output signals based on the data signals. In a typical latch-based sense amplifier design for a memory, the sense amplifier enable signal is asserted (i.e., fired) when the bitlines (true and complement) have developed sufficient separation. For example, sufficient separation may be between ten and fifteen percent of the supply voltage (Vcc), but this range may vary depending on various factors (e.g., noise or the technology implemented, such as for the bitcell or sense amplifier).

If the sense amplifier enable signal fires before sufficient separation has developed between the bitlines, erroneous data may be latched in the sense amplifier. Therefore, timing of the sense amplifier enable signal is critical. The enable signal is typically generated using delay chains, with simulations performed across process, temperature, and voltage corners to ensure accurate timing. Despite this, trimming of the sense amplifier delay chain via metal options or laser fuses is often required due to the mismatch between the simulation models and actual silicon implementation.

Various techniques are employed for providing reliable sense amplifier operation in memories, which may include differential amplifiers or conservative latch-based sense amplifier designs. Differential amplifiers may be more robust than latch-based sense amplifier designs, but are typically larger, consume more power, and are slower. Latch-based sense amplifier designs may conservatively allow a greater bitline separation (e.g., thirty percent of the supply voltage) to develop before the sense amplifier enable signal fires, but this reduces the access time and maximum frequency parameters of the design.

For high-speed applications, a cross-coupled latch-based sense amplifier may be employed, for example, with trim capability for the sense amplifier enable signal path. Various techniques are employed for trimming or modifying the sense amplifier enable signal timing, which may include trimming delays utilizing metal options or laser fuses. For example, the delay may be adjusted by removing or adding delay elements using metal options, which may add minimally to die area overhead but may require one or more metal mask changes that adds to the die cost. In addition, each die generally cannot be trimmed separately with different delays. For the laser fuses approach, laser fuses are employed to trim delay chains, which allow each die to be trimmed separately to optimize performance parameters for each die. However, laser fuses occupy substantial die area and expensive laser equipment is generally required to blow the fuses. As a result, there is a need for improved sense amplifier techniques.

SUMMARY

In accordance with one embodiment of the present invention, an integrated circuit includes a plurality of memory cells; a sense amplifier adapted to provide a sense amplifier output signal based on data provided by the plurality of memory cells, wherein the sense amplifier output signal is provided under control of a sense amplifier enable signal; at least one configuration fuse; and a delay control circuit adapted to provide a delay to the sense amplifier enable signal based on a value provided by the at least one configuration fuse.

In accordance with another embodiment of the present invention, a programmable logic device includes a block of memory having a plurality of columns of memory cells and a corresponding plurality of sense amplifiers adapted to provide sense amplifier output signals based on information stored in the block of memory; at least one fuse adapted to provide a delay control output signal; and a delay control circuit adapted to selectively determine when the sense amplifier output signals are provided based on the delay control output signal provided by the at least one fuse.

In accordance with another embodiment of the present invention, a method of applying a variable delay to a control signal of a sense amplifier within a programmable logic device includes programming a value into at least one configuration fuse within the programmable logic device; and delaying the control signal by a selected amount of delay based on the value stored in the at least one configuration fuse.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
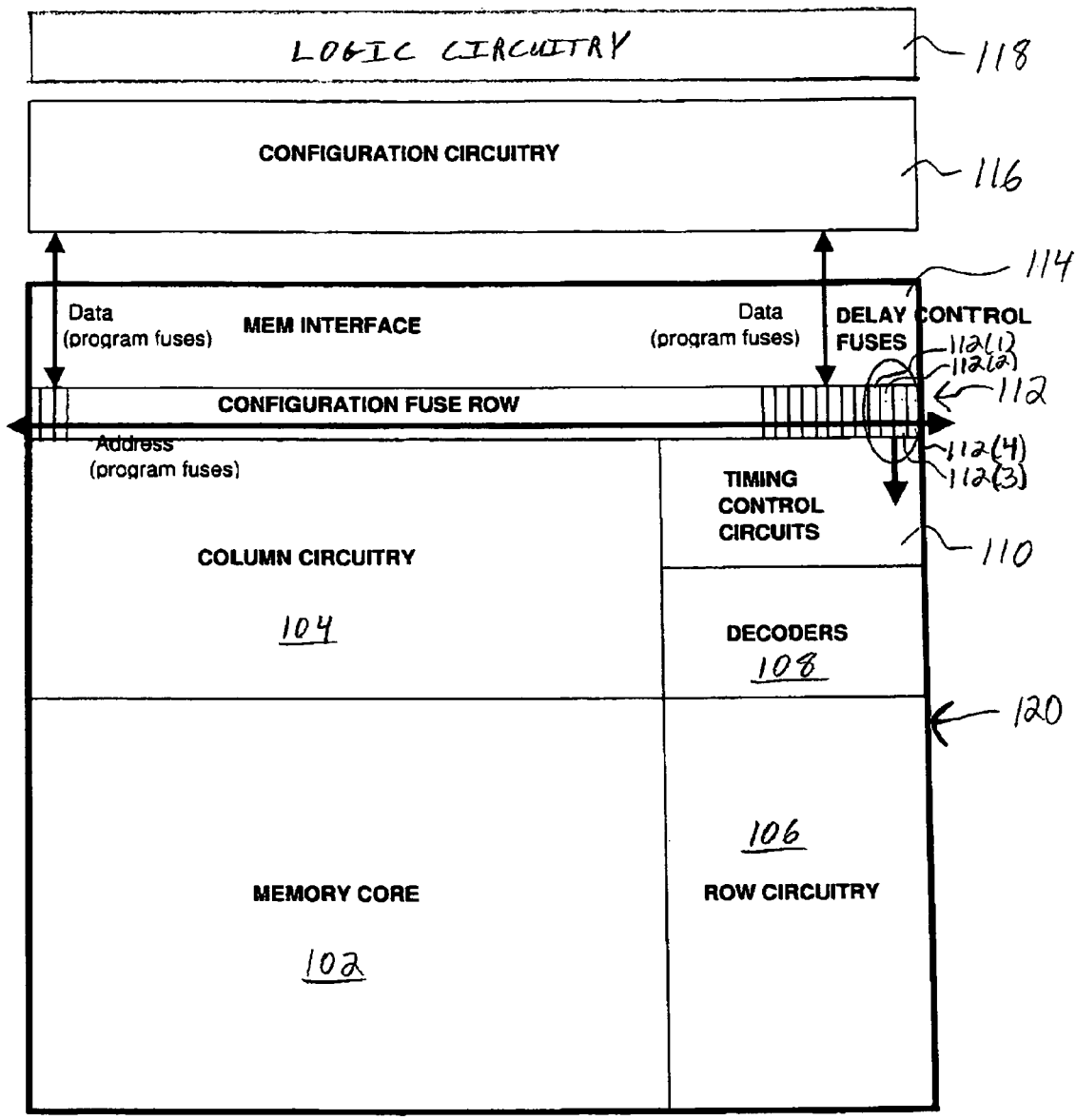
FIG. 1 shows a block diagram illustrating an integrated circuit in accordance with an embodiment of the present invention.

FIG. 1 shows a block diagram illustrating an integrated circuit 100 in accordance with an embodiment of the present invention. Integrated circuit 100 (e.g., a programmable logic device such as a field programmable gate array or a complex programmable logic device) includes a memory core 102, column circuitry 104, row circuitry 106, decoders 108, timing and control circuits 110, configuration fuses 112, a memory interface 114, configuration circuitry 116, and logic circuitry 118. Logic circuitry 118 is optional circuitry within integrated circuit 100 for performing user-defined logic or functions.

Memory core 102 represents a block of embedded memory cells within integrated circuit 100. In this exemplary implementation, only one memory core 102 is shown, however, it should be understood that any number of blocks of embedded memory cells (i.e., memory cores 102 and associated circuitry) may be implemented. Memory core 102 has associated column circuitry 104, row circuitry 106, decoders 108, timing and control circuits 110, and memory interface 114, which generally form an embedded memory block 120 within integrated circuit 100.

Each memory block 120 within integrated circuit 100 generally has associated with it a number of configuration fuses 112. Configuration fuses 112 (e.g., programmable static random access memory cells, fuses, anti-fuses, or other types of configuration memory (volatile or nonvolatile), including one-time programmable devices) may be grouped or distributed within integrated circuit 100 as desired or depending upon the particular design or specifications. As an example, as shown in FIG. 1, configuration fuses 112 associated with memory block 120 may be arranged in one or more configuration fuse rows and may be incorporated as part of memory block 120.

In accordance with an embodiment of the present invention, one or more of the configuration fuses 112 may be utilized as delay control fuses for a sense amplifier enable signal, as discussed further herein. For example, four of configuration fuses 112, which are separately referenced as configuration fuses 112(1) through 112(4), may be utilized as delay control fuses. Alternatively, any number of configuration fuses 112 may be employed or utilized in some fashion. For example, a certain number of configuration fuses 112 may be utilized with a decoder (e.g., rather than utilizing four of configuration fuses 112, utilize two of configuration fuses 112 along with a decoder to generate four output signals).

Configuration circuitry 116 generates global address and data signals to program configuration fuses 112 within integrated circuit 100. Consequently, there does not have to be a separate, dedicated programming circuit within integrated circuit 100 to specifically program configuration fuses 112(1) through 112(4), because configuration circuitry 116 may be utilized to program configuration fuses 112(1) through 112(4) as well as the remaining configuration fuses 112 in the conventional manner. Furthermore, in a typical implementation, all of configuration fuses 112 are not completely utilized (i.e., populated) and, thus, delay control fuses may be employed or included with no additional die area overhead.

Figure 2:
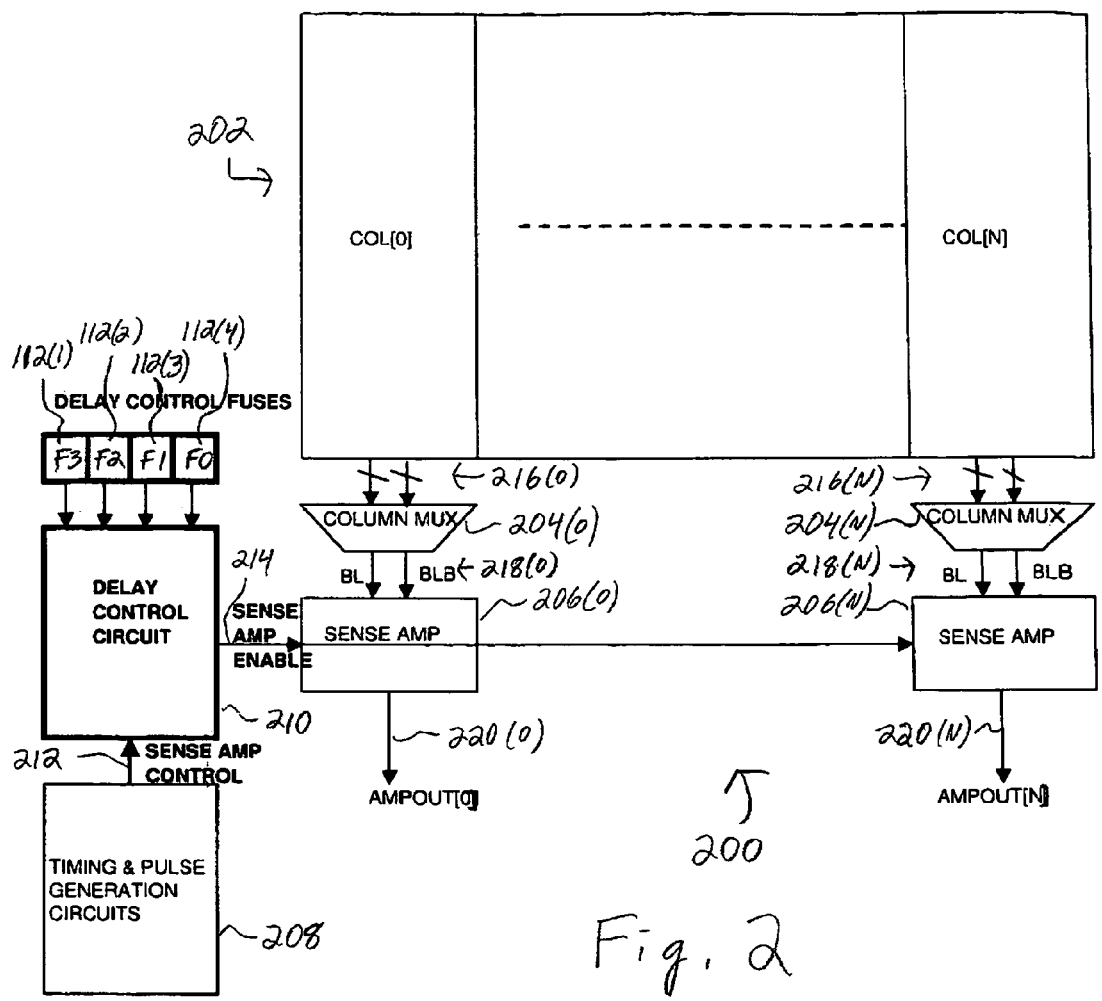
FIG. 2 shows a block diagram illustrating an exemplary implementation for a portion of the integrated circuit of FIG. 1 in accordance with an embodiment of the present invention.

Output signals provided by configuration fuses 112(1) through 112(4) are provided to timing and control circuits 110. For example, FIG. 2 shows a block diagram 200 illustrating an exemplary implementation for a portion of memory block 120 of FIG. 1 in accordance with an embodiment of the present invention. Diagram 200 includes memory cells 202, column multiplexers 204, sense amplifiers 206, timing and pulse generation circuits 208, a delay control circuit 210, and configuration fuses 112(1) through 112(4).

Memory cells 202 may represent an exemplary implementation of memory core 102 (FIG. 1), with memory cells 202 arranged in columns (labeled col[0] through col[N]). Column multiplexers 204 and sense amplifiers 206 may represent an exemplary implementation of a portion of column circuitry 104 (FIG. 1), with column multiplexers 204(0) through 204(N) and sense amplifiers 206(0) through 206(N) corresponding to col[0] through col[N] of memory cells 202, respectively.

Timing and pulse generation circuits 208 and delay control circuit 210 may represent an exemplary implementation of a portion of timing and control circuits 110 (FIG. 1). Timing and pulse generation circuits 208 provide a sense amplifier control signal 212 to delay control circuit 210, which delays sense amplifier control signal 212 under control of configuration fuses 112(1) through 112(4). Delay control circuit 210 then provides a delayed version of sense amplifier control signal 212 as a sense amplifier enable signal 214 to sense amplifiers 206.

In general, column multiplexers 204(0) through 204(N) select from among a number of bitlines 216 from memory cells 202, depending on a column address, to provide corresponding bitlines 218(0) through 218(N) (each pair of bitlines 218 being complementary bitlines labeled BL and BLB) to corresponding sense amplifiers 206(0) through 206(N). It is desired that sense amplifier enable signal 214 be asserted (i.e., fired) when bitlines 218 have developed a sufficient voltage differential between them so that sense amplifiers 206 can provide valid corresponding sense amplifier output signals 220. This timing is determined by delay control circuit 210, which adjusts the timing of sense amplifier enable signal 214 based on values stored in configuration fuses 112(1) through 112(4).

Figure 3:
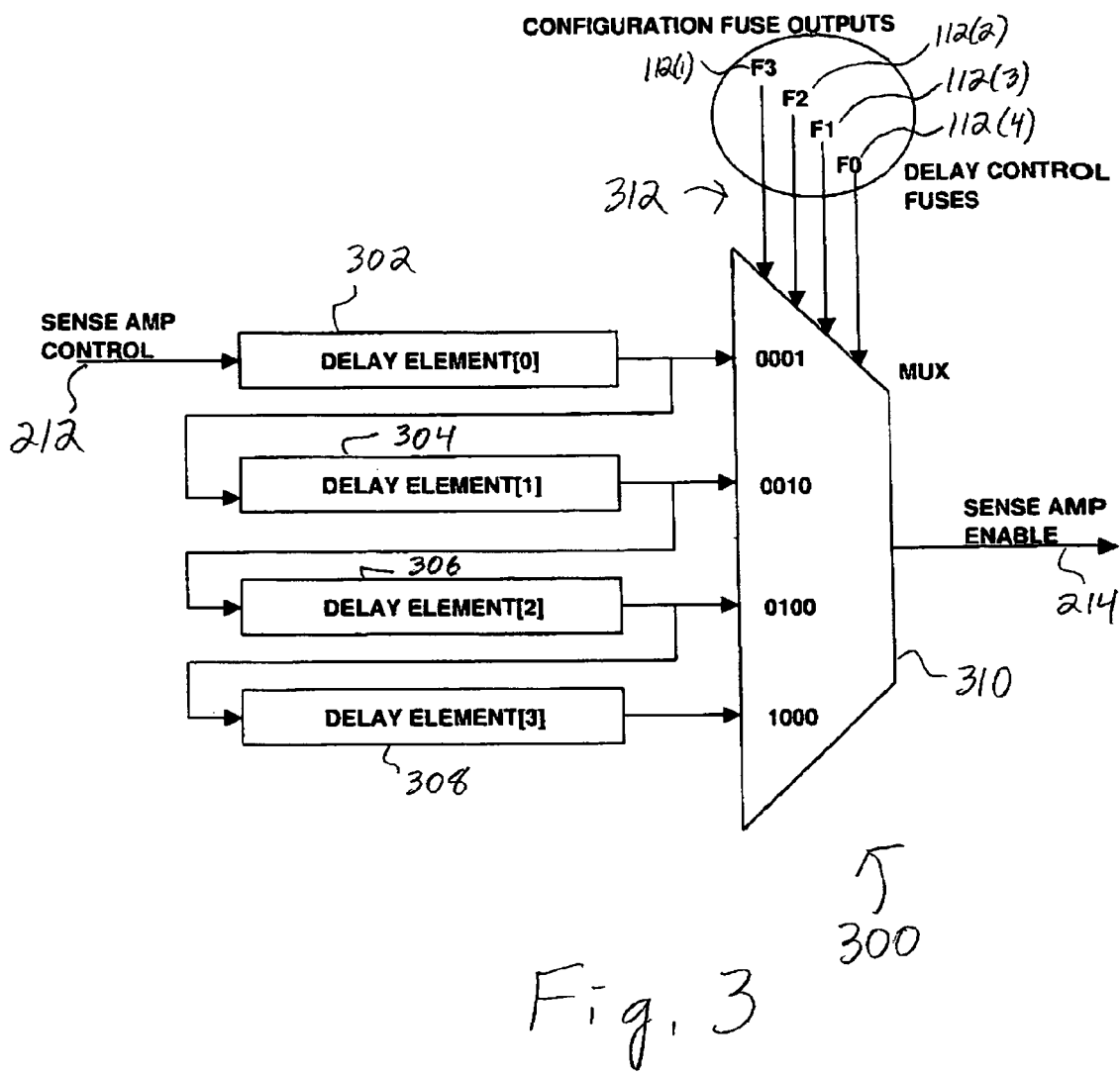
FIG. 3 shows a block diagram illustrating an exemplary implementation for a portion of the integrated circuit of FIG. 1 in accordance with an embodiment of the present invention.

FIG. 3 shows a block diagram 300 illustrating an exemplary implementation for delay control circuit 210 of FIG. 2 in accordance with an embodiment of the present invention. Diagram 300 includes delay elements 302, 304, 306, and 308 and a multiplexer 310. In general, diagram 300 illustrates an exemplary implementation for delay control circuit 210 in which a delay applied to sense amplifier control signal 212 is dependent on the values of configuration fuses 112(1) through 112(4).

For this exemplary implementation, there are four possible delay values that may be applied to sense amplifier control signal 212 (i.e., four delay paths formed by delay elements 302 through 308 which may be selected for sense amplifier control signal 212). The timing or delay applied to sense amplifier control signal 212 can be varied simply by reprogramming the values stored in configuration fuses 112(1) through 112(4) (labeled F3, F2, F1, and F0, respectively, or identified as F[3:0]), as illustrated in Table 1. The values stored in configuration fuses 112(1) through 112(4) may be changed, for example, during a full configuration or during a partial configuration sequence of the integrated circuit (e.g., programmable logic device) and thus, no mask change or expensive laser fuse methodology is required as with conventional techniques.

As illustrated in FIG. 3, output signals 312 provided by configuration fuses 112(1) through 112(4) determine the amount of delay applied to sense amplifier control signal 212 via multiplexer 310, which provides the delayed sense amplifier control signal 212 as sense amplifier enable signal 214. Specifically, for this exemplary implementation, output signals 312 having values of 0001, 0010, 0100, or 1000 results in a selection of sense amplifier control signal 212 after passing through delay element 302, delay element 302 and 304, delay element 302, 304, and 306, or delay element 302, 304, 306, and 308, respectively. Multiplexer 310 then provides the selectively delayed sense amplifier control signal 212 as sense amplifier enable signal 214.

Delay elements 302, 304, 306, and 308 provide a delay referred to as Delay[0], Delay[1], Delay[2], and Delay[3], respectively, as indicated in Table 1. As the delay applied to sense amplifier control signal 212 increases, the bitline separation of bitlines 218 (FIG. 2) increases and the access time (referred to as Tacc[0001], Tacc[0010], Tacc[0100], and Tacc[1000]) also increases as indicated in Table 1.

Figure 4:
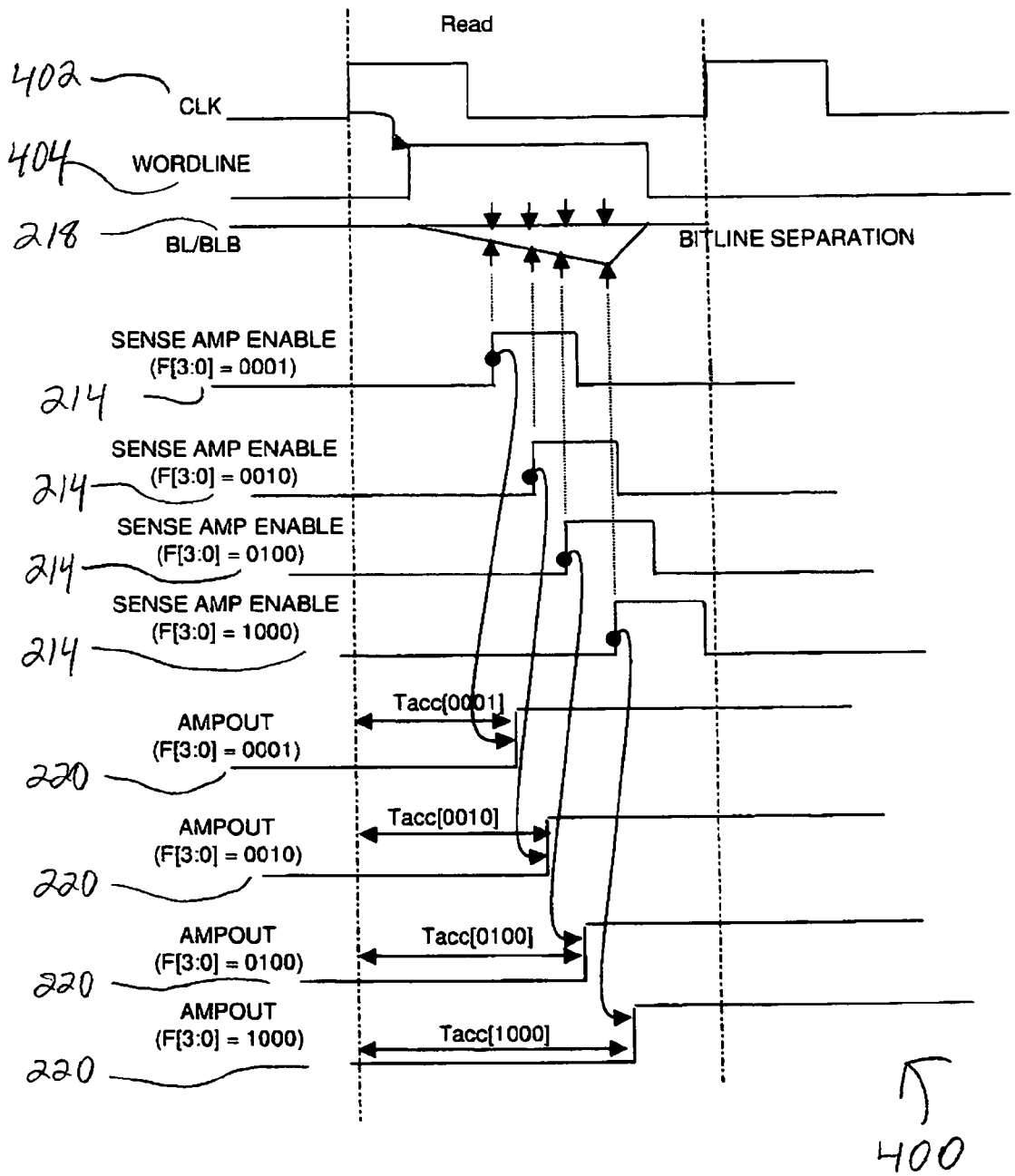
FIG. 4 shows a timing diagram for exemplary waveforms in accordance with an embodiment of the present invention.
Figure 1:
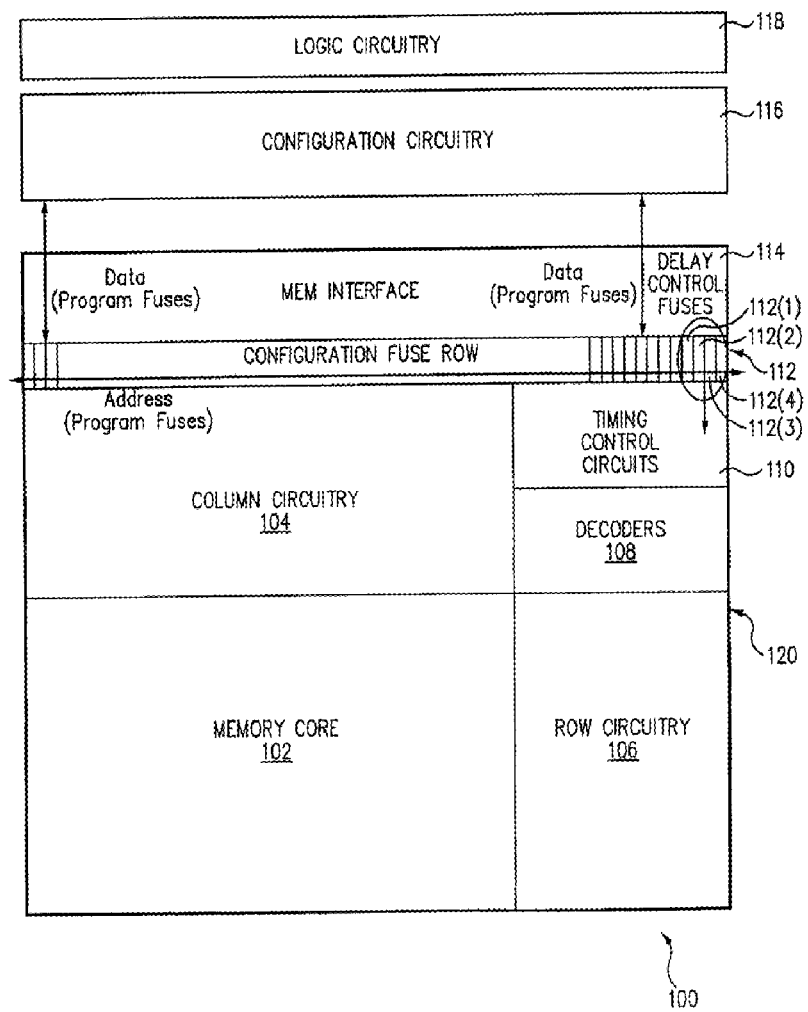
Figure 2:
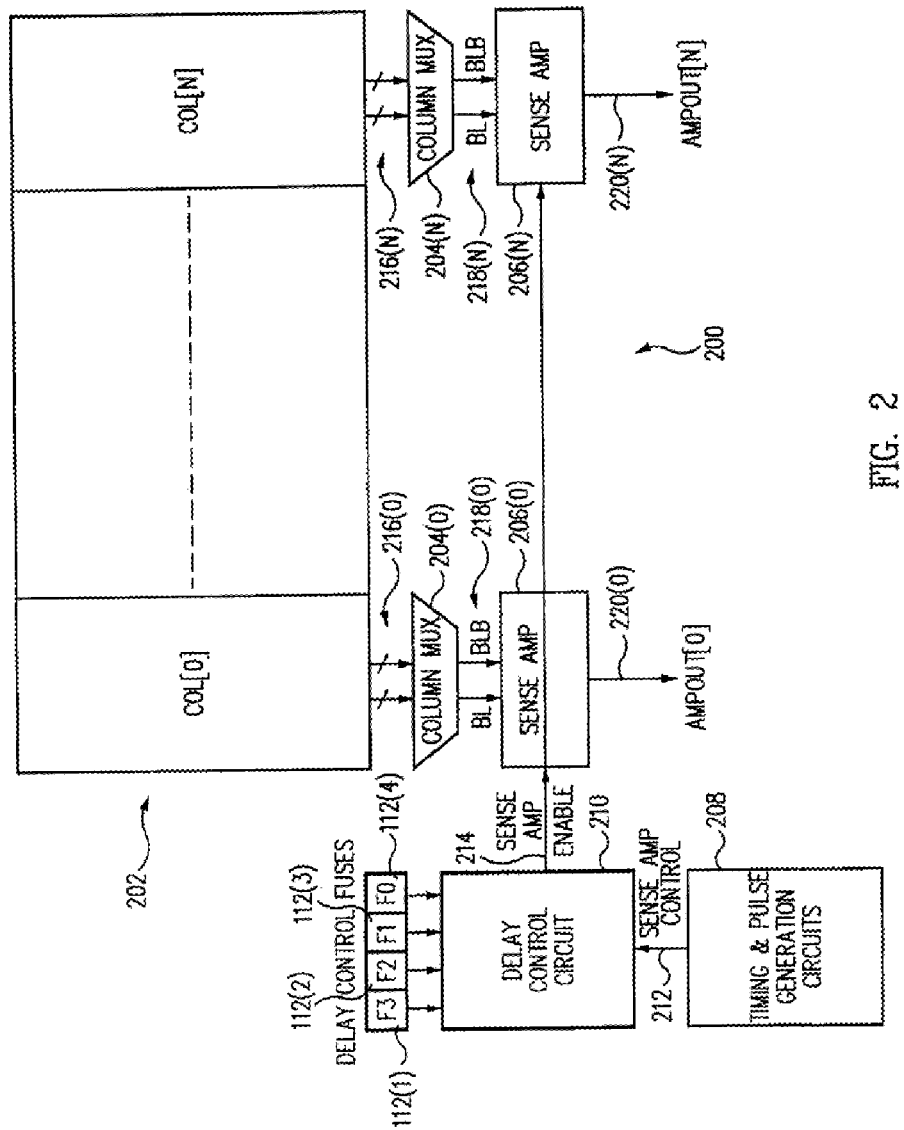
Figure 3:
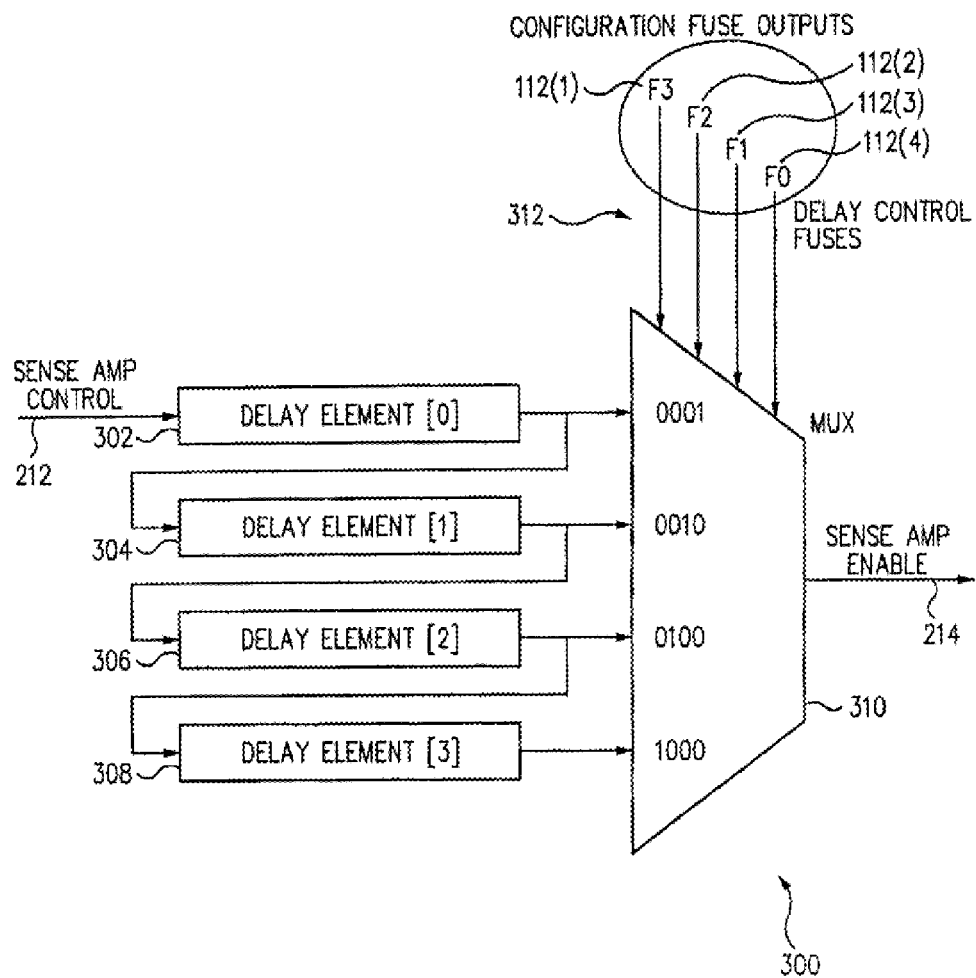
Figure 4:
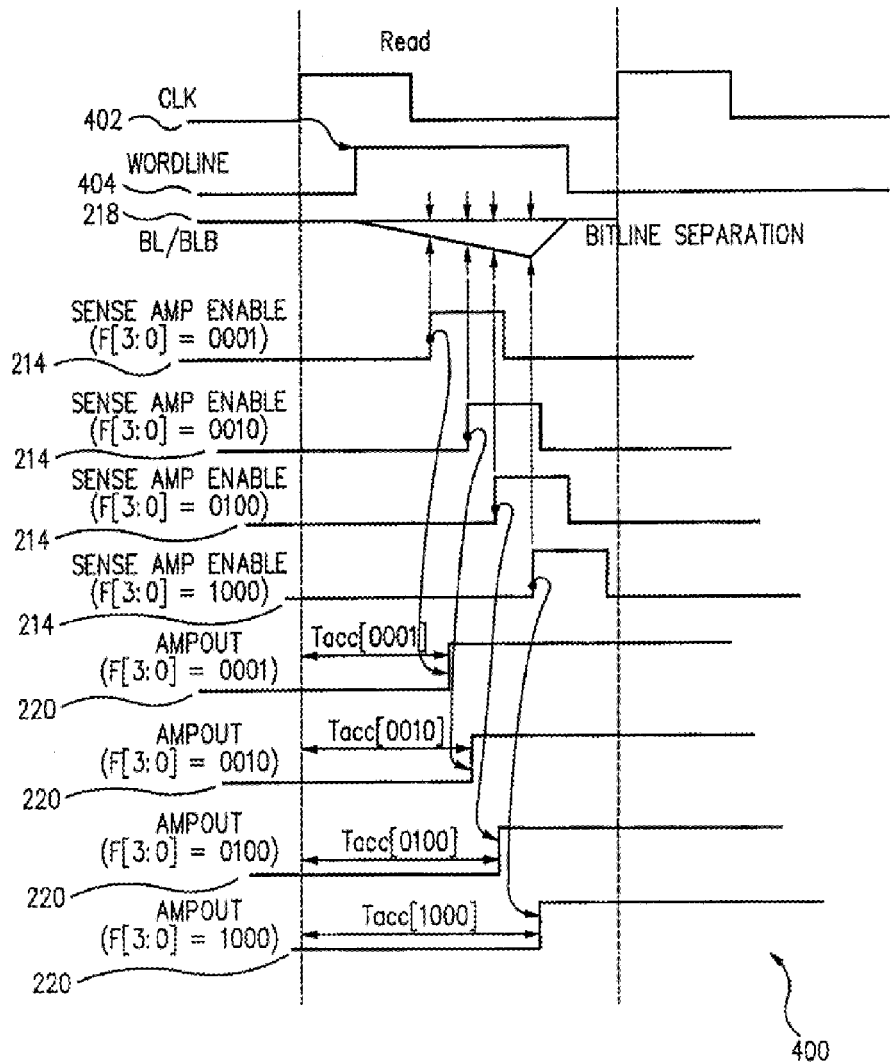

For example, FIG. 4 shows a timing diagram 400 for exemplary waveforms in accordance with an embodiment of the present invention. Timing diagram 400 shows the read timing for different settings of configuration fuses 112(1) through 112(4) by illustrating exemplary waveforms for certain signals, including a clock (CLK) signal 402, a wordline signal 404, sense amplifier enable signal 214, and one of sense amplifier output signals 220.

As illustrated in FIG. 4 and outlined in Table 1, the timing of sense amplifier enable signal 214 varies depending upon the value of the delay control fuses (configuration fuses 112(1) through 112(4) for this example and labeled F[3:0]). At a low-value setting (e.g., F[3:0]=0001) for the delay control fuses, the bitline separation of bitlines 218 is minimal and, consequently, the access time (e.g., Tacc[0001]) of sense amplifier output signal 220 is also minimal. This may be considered the most aggressive fuse setting (e.g., least margin of error) relative to the other fuse settings for the delay control fuses.

In contrast, at a high-value setting (e.g., F[3:0]=1000) for the delay control fuses, the bitline separation of bitlines 218 is relatively much greater and, consequently, the access time (e.g., Tacc[1000]) of sense amplifier output signal 220 is also relatively much greater. This may be considered the most conservative fuse setting (e.g., most margin of error) relative to the other fuse settings for the delay control fuses. In general, as the delay applied to sense amplifier control signal 212 is increased based on the values stored in the delay control fuses, the delay prior to asserting sense amplifier enable signal 214 increases along with the bitline separation and the access time of sense amplifier output signal 220.

TABLE 1

| Fuse Code F[3:0] | Delay | Access Time |
| --- | --- | --- |
| 0001 | Delay[0] | Tacc[0001] |
| 0010 | Delay[0] + Delay[1] | Tacc[0010] |
| 0100 | Delay[0] + Delay[1] + Delay[2] | Tacc[0100] |
| 1000 | Delay[0] + Delay[1] + Delay[2] + Delay[3] | Tacc[1000] |

Systems and methods are disclosed herein to provide sense amplifiers and associated control signals with appropriate delays. For example, in accordance with an embodiment of the present invention, a delay chain for the sense amplifier enable signal is not trimmed via metal options or laser fuses, but rather the configurable memory cells (e.g., SRAM configuration cells) within the programmable logic device are programmed to trim the sense amplifier enable signal delay. Thus, for example, this technique provides a sense amplifier scheme in which the sense amplifier latches the correct data from embedded memory cells without the need for expensive mask changes or a laser fuse methodology.

In general, in accordance with an embodiment of the present invention, programmable delay control fuses (e.g., SRAM configuration memory cells within a programmable logic device) may be utilized to vary a timing of a sense amplifier enable signal for an embedded memory block. For example, output signals from the selected delay control fuses may form the control signals to a multiplexer that selects from among a number of different delay paths based on the values of the output signals.

This technique may provide certain advantages. As an example, circuitry for fuse configuration may already exist within the integrated circuit and, thus no additional die area or programming overhead is required to configure the delay control fuses. The only die area overhead may be for additional fuse elements if no spare fuses are available in the design. However, there may be vacancies in a fuse row, for example, which could be utilized to accommodate the additional delay control fuses and minimize die area overhead.

As compared to conventional techniques, no mask change is necessary and different delay settings may be tested (selected) by merely reprogramming the delay control fuses. Furthermore, no special equipment is required for programming the delay control fuses, as may be the case for the laser fuse approach.

Embodiments described above illustrate but do not limit the invention. It should also be understood that numerous modifications and variations are possible in accordance with the principles of the present invention. Accordingly, the scope of the invention is defined only by the following claims.

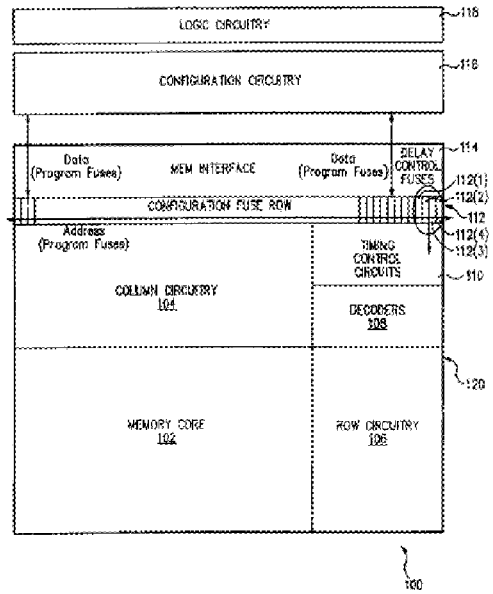

We claim:

1. An integrated circuit comprising:
   a plurality of memory cells;
   a sense amplifier adapted to provide a sense amplifier output signal based on data provided by the plurality of memory cells, wherein the sense amplifier output signal is provided under control of a sense amplifier enable signal;
   at least one configuration fuse, wherein the at least one configuration fuse comprises programmable static random access memory adapted to store and provide a value having logical high and logical low signal levels based on the programming;
   configuration memory adapted to configure the integrated circuit;
   a configuration circuit adapted to configure the at least one configuration fuse and the configuration memory; and
   a delay control circuit adapted to provide a delay to the sense amplifier enable signal based on the value provided by the at least one configuration fuse.

2. The integrated circuit of claim 1, wherein the delay control circuit comprises:
   a plurality of delay elements providing corresponding delayed versions of an enable signal; and
   a multiplexer, wherein the multiplexer is controlled based on the value provided by the at least one configuration fuse to select from among the delayed versions of the enable signal to provide as the sense amplifier enable signal.

3. The integrated circuit of claim 1, further comprising logic circuits adapted to be configured to provide user-defined functions.

4. The integrated circuit of claim 1, wherein the at least one configuration fuse comprises four configuration fuses adapted to provide four control signals to the delay control circuit.

5. The integrated circuit of claim 1, further comprising a decoder adapted to receive the value provided by the at least one configuration fuse and provide the decoded value to the delay control circuit to control the delay applied to the sense amplifier enable signal.

6. The integrated circuit of claim 1, wherein the integrated circuit comprises a programmable logic device, wherein the at least one configuration fuse is formed as part of the configuration memory.

7. A programmable logic device comprising:
   a block of memory having a plurality of columns of memory cells and a corresponding plurality of sense amplifiers adapted to provide sense amplifier output signals based on information stored in the block of memory;

at least one fuse adapted to provide a delay control output signal, wherein the at least one fuse comprises programmable static random access memory adapted to store and provide a value having logical high and logical low signal levels based on the programming;

configuration memory adapted to configure the programmable logic device;

a configuration circuit adapted to configure the at least one fuse and the configuration memory; and a delay control circuit adapted to selectively determine when the sense amplifier output signals are provided based on the delay control output signal provided by the at least one fuse.

8. The programmable logic device of claim 7, further comprising a plurality of the blocks of memory and a corresponding plurality of the delay control circuits.

9. The programmable logic device of claim 7, wherein the delay control circuit comprises:

a plurality of different, selectable delay paths for a sense amplifier enable signal that controls when the sense amplifier output signals are provided from the sense amplifiers; and a multiplexer adapted to select the desired delay path for the sense amplifier enable signal based on the delay control output signal.

10. The programmable logic device of claim 7, wherein the block of memory further comprises a memory interface adapted to interface with the configuration circuit.

11. The programmable logic-device of claim 7, further comprising logic circuits adapted to be configured to provide user-defined functions.

12. The programmable logic device of claim 7, wherein the at least one fuse comprises four fuses adapted to provide four control signals to the delay control circuit.

13. The programmable logic device of claim 7, further comprising a decoder adapted to receive the delay control output signal provided by the at least one fuse and provide a decoded value to the delay control circuit.

14. A method of applying a variable delay to a control signal of a sense amplifier within a programmable logic device, the method comprising:

programming a value into at least one configuration fuse within the programmable logic device, wherein the at least one configuration fuse comprises programmable static random access memory adapted to store and provide a value having logical high and logical low signal levels based on the programming;

configuring the programmable logic device for its intended operation during the programming, wherein the programming further programs the configuration memory of the programmable logic device; and delaying the control signal by a selected amount of delay based on the value stored in the at least one configuration fuse.

15. The method of claim 14, wherein the control signal determines when to enable the sense amplifier.

16. The method of claim 14, further comprising decoding the value stored in the at least one configuration fuse.

17. The method of claim 14, further comprising reprogramming the at least one configuration fuse to store a different value.

* * * * *

UNITED STATES PATENT AND TRADEMARK OFFICE
CERTIFICATE OF CORRECTION

PATENT NO. : 7,177,207 B1  
APPLICATION NO. : 11/015369  
DATED : February 13, 2007  
INVENTOR(S) : Vernenket et al.

It is certified that error appears in the above-identified patent and that said Letters Patent is hereby corrected as shown below:

The title page showing an illustrative figure(s) 1 should be deleted and substitute therefore the attached title page consisting of Fig. 1.

The drawing sheets 1-4 consisting of Fig(s) 1-4 should be deleted and substitute therefore the attached drawing sheets 1-4 consisting of Fig(s) 1-4.

Signed and Sealed this

Twenty-seventh Day of May, 2008

JON W. DUDAS  
*Director of the United States Patent and Trademark Office*

(12) United States Patent
Vernenker et al.

(10) Patent No.: US 7,177,207 B1
(45) Date of Patent: *Feb. 13, 2007

(54) SENSE AMPLIFIER TIMING

(75) Inventors: Hemanshu T. Vernenker, Austin, TX (US); Margaret C. Tait, Austin, TX (US); Allen White, Austin, TX (US)

(73) Assignee: Lattice Semiconductor Corporation, Hillsboro, OR (US)

(*) Notice: Subject to any disclaimer, the term of this patent is extended or adjusted under 35 U.S.C. 154(b) by 63 days.

This patent is subject to a terminal disclaimer.

(21) Appl. No.: 11/015,369

(22) Filed: Dec. 17, 2004

(51) Int. Cl.
*G11C 7/00* (2006.01)

(52) U.S. Cl. .................. 365/194; 365/225.7; 326/39; 326/41

(58) Field of Classification Search .............. 365/194, 365/225.7; 326/39, 41
See application file for complete search history.

(56) References Cited

U.S. PATENT DOCUMENTS

| | | | |
|---|---|---|---|
| 4,687,951 A * | 8/1987 | McElroy | 327/291 |
| 4,787,047 A * | 11/1988 | Wei | 326/38 |
| 5,424,985 A | 6/1995 | McClure et al. | |
| 5,656,949 A * | 8/1997 | Yip et al. | 326/38 |
| 5,841,296 A | 11/1998 | Churcher et al. | |
| 5,991,219 A | 11/1999 | Nakashima | |
| 6,034,548 A | 3/2000 | Churcher et al. | |
| 6,133,751 A | 10/2000 | Churcher et al. | |
| 6,239,616 B1 | 5/2001 | Churcher et al. | |
| 6,480,024 B2 | 11/2002 | Dietrich et al. | |
| 6,499,111 B2 | 12/2002 | Mullarkey | |
| 6,710,622 B1 | 3/2004 | Chan | |
| 6,944,090 B2 * | 9/2005 | Anand et al. | 365/233 |

OTHER PUBLICATIONS

Louis De La Cruz and Allen White. Sense Amplifier Systems and Methods, U.S. Appl. No. 10/797,759, filed Mar. 9, 2004.

* cited by examiner

*Primary Examiner*—Richard Elms
*Assistant Examiner*—Eric J. Wendler
(74) *Attorney, Agent, or Firm*—MacPherson Kwok Chen & Heid LLP; Greg J. Michelson

(57) ABSTRACT

Systems and methods provide sense amplifier timing techniques. For example, in accordance with an embodiment of the present invention, an integrated circuit includes a plurality of memory cells and a sense amplifier that provides a sense amplifier output signal based on data provided by the plurality of memory cells, with the sense amplifier output signal provided under control of a sense amplifier enable signal. A delay control circuit provides a delay to the sense amplifier enable signal based on a value provided by at least one configuration fuse.

17 Claims, 4 Drawing Sheets